US008851996B2

(12) United States Patent
Russo

(10) Patent No.: US 8,851,996 B2
(45) Date of Patent: Oct. 7, 2014

(54) DYNAMIC MAGNETOMETER CALIBRATION

(75) Inventor: David Russo, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/588,954

(22) Filed: Aug. 17, 2012

(65) Prior Publication Data

US 2014/0051518 A1 Feb. 20, 2014

(51) Int. Cl.
*A63F 13/06* (2006.01)
*G06T 15/00* (2011.01)

(52) U.S. Cl.
USPC ............................... 463/38; 463/37; 345/419

(58) Field of Classification Search
USPC ........ 324/202, 207.11, 207.25; 345/157, 419; 455/556.1; 463/32–33, 37–38; 702/93
See application file for complete search history.

(56) References Cited

U.S. PATENT DOCUMENTS

| 7,275,008 | B2 | 9/2007 | Plyvanainen |
| 7,868,610 | B2 * | 1/2011 | Velinsky et al. ......... 324/207.25 |
| 7,978,174 | B2 * | 7/2011 | Lim et al. ...................... 345/157 |
| 8,041,536 | B2 | 10/2011 | Ohta |
| 2008/0146336 | A1 * | 6/2008 | Feldman et al. ................ 463/37 |
| 2009/0278791 | A1 | 11/2009 | Slycke et al. |
| 2010/0105475 | A1 * | 4/2010 | Mikhailov et al. .............. 463/33 |
| 2010/0307016 | A1 | 12/2010 | Mayor et al. |
| 2011/0077889 | A1 * | 3/2011 | Vogt ................................ 702/93 |
| 2011/0124410 | A1 | 5/2011 | Mao et al. |
| 2011/0241656 | A1 * | 10/2011 | Piemonte et al. ........ 324/207.11 |
| 2011/0256930 | A1 | 10/2011 | Jaouen |
| 2011/0287837 | A1 * | 11/2011 | Wang et al. ..................... 463/31 |
| 2012/0026166 | A1 * | 2/2012 | Takeda et al. ................. 345/419 |
| 2012/0078562 | A1 | 3/2012 | Yamada et al. |
| 2012/0086438 | A1 * | 4/2012 | Tu ................................. 324/202 |
| 2012/0157158 | A1 * | 6/2012 | Mayor et al. ............... 455/556.1 |
| 2012/0202593 | A1 | 8/2012 | Ito et al. |
| 2012/0277000 | A1 * | 11/2012 | Vange ............................. 463/37 |
| 2012/0285274 | A1 * | 11/2012 | Almalki et al. .............. 73/866.3 |

FOREIGN PATENT DOCUMENTS

EP 2441505 A2 4/2012

OTHER PUBLICATIONS

Nasiri, et al., "Motion Processing: The Next Breakthrough Function in Handsets", Retrieved at <<http://invensense.com/mems/gyro/documents/whitepapers/InvenSense_MotionProcessing_MPUApps_WhitePaper.pdf>>, Jul. 2009, pp. 10.
European Patent Office, International Search Report & Written Opinion of PCT Patent Application No. PCT/US2013/055219, Jan. 8, 2014, 9 Pages.

* cited by examiner

*Primary Examiner* — Dmitry Suhol
*Assistant Examiner* — Jason Yen
(74) *Attorney, Agent, or Firm* — Gregg Wisdom; Micky Minhas

(57) ABSTRACT

Embodiments related to calibrating a game controller including a magnetometer during game play are disclosed. One embodiment provides a method comprising sampling magnetic information received from the magnetometer, and outputting, to a computing device, an initial game controller orientation signal derived from a first sample of a plurality of samples of the magnetic information and from directional offset data. The method further comprises calculating updated directional offset data based on the plurality of samples of the magnetic information and on the directional offset data, and outputting to the computing device a calibrated game controller orientation signal derived from a second sample of the plurality of samples of the magnetic information and the updated directional offset data.

20 Claims, 6 Drawing Sheets

DYNAMIC MAGNETOMETER CALIBRATION

BACKGROUND

Various devices, such as game controllers, may include magnetometers to determine the orientation of the device, and thus to effect control over the device and/or other devices. Although such sensors are typically calibrated one or more times during production, such sensors may be susceptible to a variety of environmental factors during use.

SUMMARY

Embodiments are disclosed that relate to calibrating a game controller including a magnetometer during game play. For example, one disclosed embodiment provides a method comprising sampling magnetic information received from the magnetometer, each sample of the magnetic information including a vector component of an ambient magnetic field along each of a first axis, a second axis, and a third axis, the first axis, the second axis, and the third axis being orthogonal to each other. The method further comprises outputting, to a computing device, an initial game controller orientation signal derived from a first sample of a plurality of samples of the magnetic information and from directional offset data including a first directional offset along the first axis, a second directional offset along the second axis, and a third directional offset along the third axis. The method further comprises calculating updated directional offset data based on the plurality of samples of the magnetic information and on the directional offset data, and outputting to the computing device a calibrated game controller orientation signal derived from a second sample of the plurality of samples of the magnetic information and the updated directional offset data.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
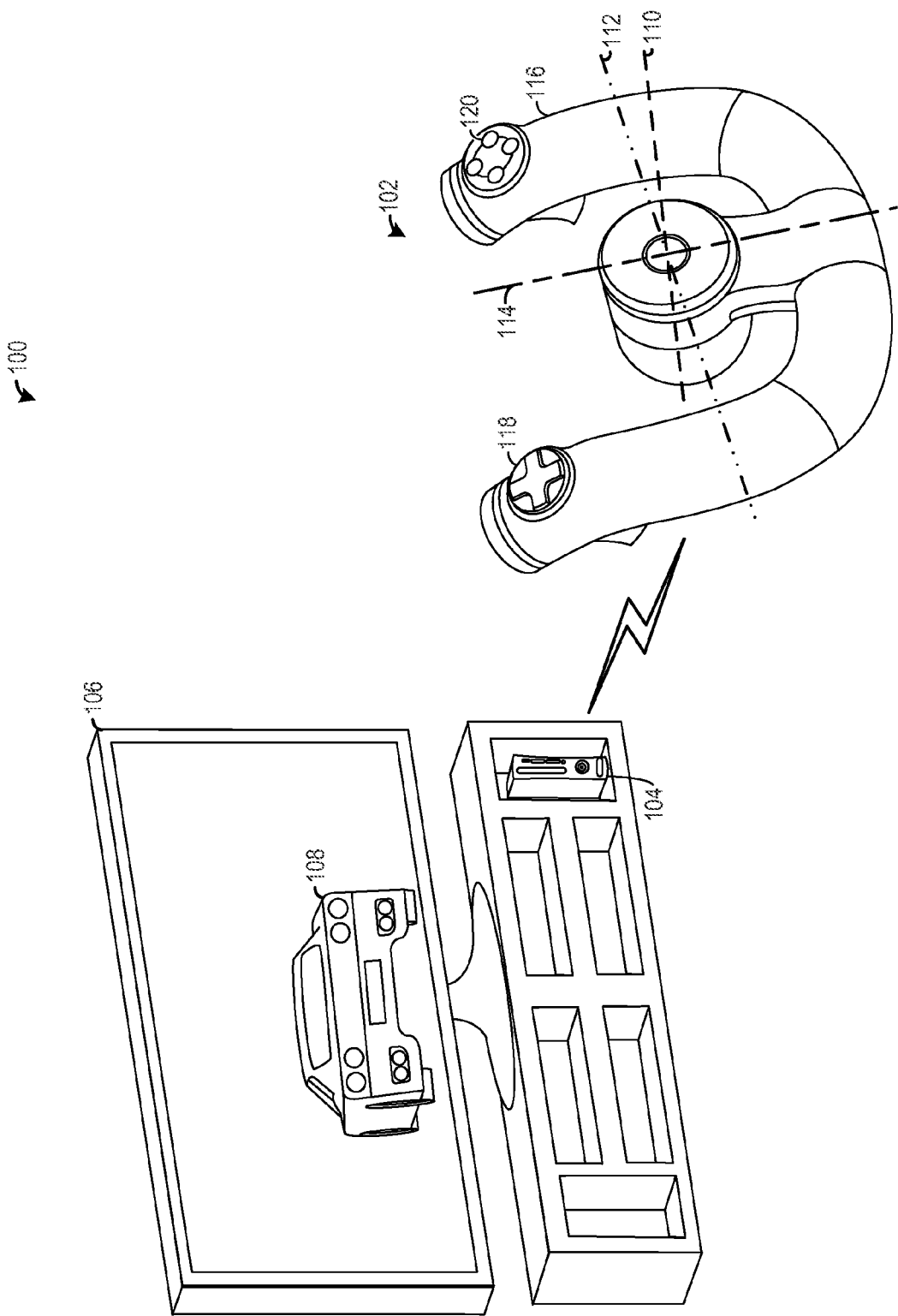
FIG. 1 shows an example use environment for using a game controller including a magnetometer.

As mentioned above, various devices, such as game controllers, may include one or more magnetometers to determine orientation of the device. Typical magnetometers are configured to provide magnetic information comprising a representation (e.g., vector component(s)) of the ambient magnetic field along one or more axes. As used herein, "ambient magnetic field" refers to the earth's magnetic field plus any other detectable fields, such as magnetic field generated by one or more nearby devices, and/or distortion of the earth's magnetic field by one or more nearby materials.

Since the local ambient magnetic field is substantially time-independent during the use of said devices, the field may provide a reference point for detecting orientation of the device. In other words, upon determining the orientation of the ambient magnetic field, manipulation of a game controller including a magnetometer may be determined based on displacement of the game controller relative to the ambient magnetic field. Such a configuration is intended to be non-limiting, and the magnetic information provided by the magnetometer may be usable to determine orientation and/or position of the game controller via any suitable mechanism or combination of mechanisms.

However, it will be appreciated that measurement of the ambient magnetic field may be impacted by various materials that may be present in or around the device. For example, solder, connectors, screws, and other components comprising ferrous materials may distort earth's magnetic field. As such materials are typically not symmetrically distributed about the magnetometer, it will be appreciated that said distortion may be orientation-dependent. To compensate for this distortion, each magnetometer may be calibrated within the final product at the manufacturing level. Said calibration may comprise, for each axis the magnetometer is configured to measure, adjustment of the gain (sensitivity) and/or adjustment of the axis offset, for example.

Although such adjustments may provide accurate measurements "out-of-the-box," it will be further appreciated that various factors may impact the accuracy of the magnetometer after the initial calibration(s). For example, batteries of varying chemistry (e.g., alkaline vs. NiMH) may distort the magnetic field differently, and may thus require unique calibrations. As another example, if the device housing includes one or more ferrous materials (e.g., via chrome-plating, etc.), changes in said housing (e.g., shift in position, microfractures due to physical trauma, etc.) may impact the performance of the magnetometer. As yet another example, external fields generated within the environment may also cause shifts to the calibration.

Given the dynamic nature of such factors, it will be appreciated that it may be desirable to dynamically calibrate the magnetometer during use. Accordingly, embodiments are disclosed herein that relate to calibrating a game controller including a magnetometer during game play. In other words, the game controller may be designed to provide the calibration while concurrently effecting control over a computing device. As such, no active user calibration (e.g., holding in a pre-defined position, performing a pre-defined motion, etc.) is needed before or during game play. In this way, a user may be able to pick up the controller, take any position, and begin using the controller without performing any explicit calibration.

FIG. 1 shows an embodiment of an example use environment 100 for using game controller 102 including a magnetometer (not illustrated). As illustrated, game controller 102 lacks an external support (e.g., steering column), and may therefore be freely manipulable to any orientation. Environment 100 comprises computing device 104 operatively coupled to display device 106. Computing device 104 may be configured to execute an application program (e.g., racing game) comprising rendered object 108 (e.g., a vehicle) for output via display device 106. Controller 102 may be configured to communicate (e.g., via one or more wireless and/or wired connections) a game controller orientation signal derived from the magnetic information received from the magnetometer to computing device 104 such that manipulation of controller 102 effects an associated manipulation of rendered object 108. For example, clockwise rotation of controller 102 about axis 110 may effect a rightward turn of object 108.

It will be understood that a racing game scenario is presented for the purpose of example, and is not intended to be limiting in any manner. For example, in other embodiments, rendered object 108 may comprise a plane rendered by a flight simulation game, and thus rotation of controller 102 about axis 112 may effect a corresponding upward or downward pitch of object 108. In yet other embodiments, rotation of controller 102 about axis 114 may effect a corresponding leftward or rightward yaw of rendered object 108. It will be appreciated that motion of controller 102 may be detectable along any one or more degrees of freedom "DOF" and that said motion may effect any suitable control over computing device 104 without departing from the scope of the present disclosure.

Figure 8:
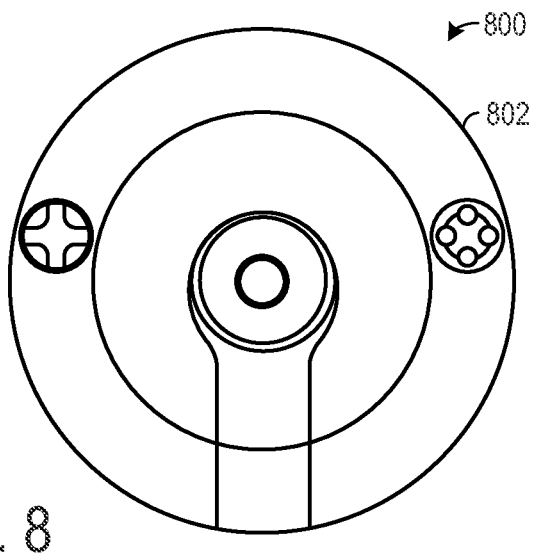
FIG. 8 shows a wireless controller according to an embodiment of the present disclosure.

As illustrated, controller 102 further comprises U-shaped handle portion 116 (e.g., yoke wheel) configured to be held in one or both hands by the game player. This is not meant to be limiting in any way. In other embodiments, handle portion 116 may comprise a substantially circular (e.g., O-shaped) configuration, as illustrated in FIG. 8, for example. In still other embodiments, a game controller may take virtually any shape and/or may be integrated into another device, such as a handheld mobile device. Controller 102 may optionally comprise directional input mechanism 118 (e.g., directional pad, joystick, etc.), input mechanisms 120 (e.g., buttons, triggers, etc.), and/or other user controls. It will be understood that this configuration is presented for the purpose of example, and that a game controller may have any suitable configuration without departing from the scope of the present disclosure.

Regardless of the specific configuration, it will be appreciated that controller 102 may be manipulable to any suitable orientation. In other words, controller 102 may have any orientation during game play. Accordingly, as mentioned above, the ambient magnetic field may be usable to determine orientation of controller 102. Although the present disclosure is directed towards using magnetometers to determine orientation, it will be appreciated that additional sensors (e.g., accelerometers, gyroscopes, etc.) may be used in conjunction with the magnetometer. For example, in some embodiments, the magnetometer may be configured to detect the ambient magnetic field along two axes (e.g., axis 110 and axis 112). Accordingly, in such scenarios, when the ambient magnetic field is oriented along the third axis (e.g., axis 114), rotation of controller 102 along said axis may not be detectable via the magnetometer, and thus one or more additional sensors may be used. As another example, the magnetometer may be usable in conjunction with a rotation sensor (e.g., gyroscope) in order to attenuate non-idealities of the rotation sensor (e.g., gyroscopic drift). It will be appreciated that these scenarios are presented for the purpose of example.

Figure 2A:
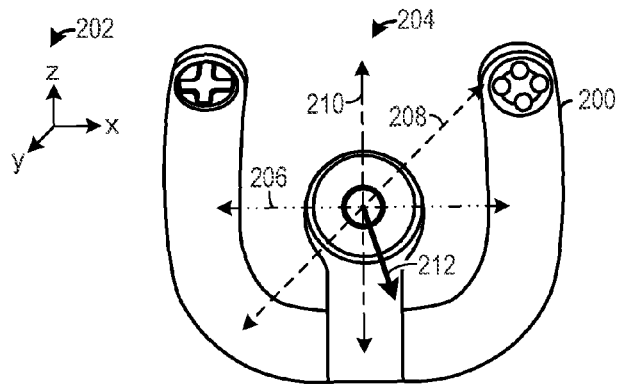
FIGS. 2A-2C show example manipulations of a game controller.
Figure 2B:
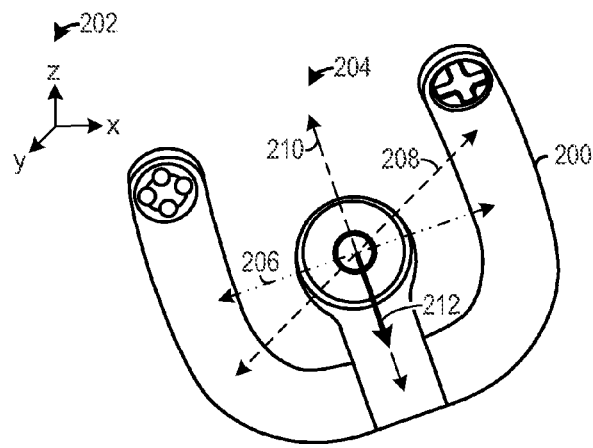
Figure 2C:
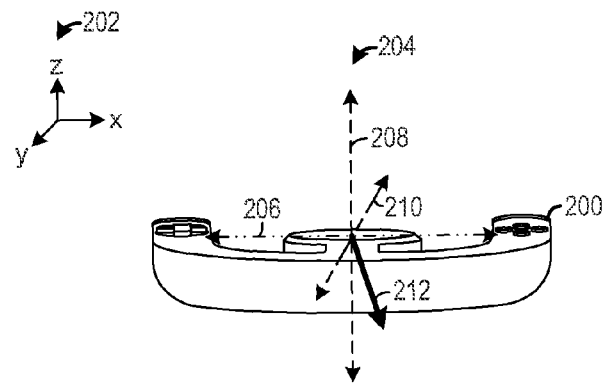

Turning now to FIGS. 2A-2C, example manipulation of a wireless controller 200 including a magnetometer (e.g., wireless controller 102 of FIG. 1) within external reference frame 202 is shown. As used herein "external reference frame" refers to the reference frame of the surrounding environment (e.g., z-axis perpendicular to earth's surface). FIG. 2A further comprises internal reference frame 204 including first axis 206, second axis 208, and third axis 210. As used herein "internal reference frame" refers to the reference frame of the magnetometer. It will be appreciated that the illustrated orientation of internal reference frame 204 relative to external reference frame 202 is presented for the purpose of example, and internal reference frame 204, and hence the magnetometer, may comprise any suitable orientation within controller 200 without departing from the scope of the present disclosure. FIG. 2A further illustrates ambient field vector 212 representing the ambient magnetic field.

Figure 3A:
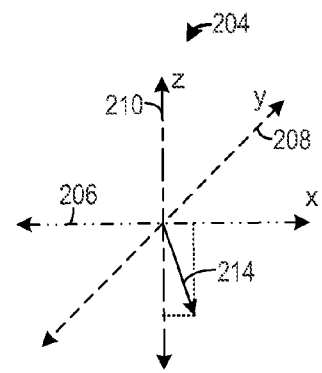
FIGS. 3A-3C show the internal reference frame corresponding to the example manipulations of FIGS. 2A-2C.

FIG. 3A shows another representation of internal reference frame 204 of FIG. 2A. FIG. 3A further comprises vector 214 representing ambient field vector 212 of FIG. 3A relative to internal reference frame 204. As mentioned above, motion of controller 200 may be determined by identifying a displacement of controller 200 relative to a reference vector. Accordingly, for the purpose of example, vector 214 will be used as an example reference vector for the remaining discussion of FIGS. 2 and 3.

Figure 3B:
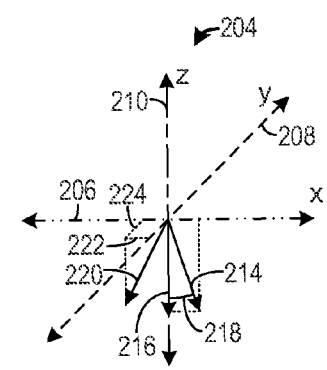

FIG. 2B shows controller 200 after counter-clockwise rotation from the orientation of FIG. 2A. As illustrated, ambient field vector 212 is oriented substantially along third axis 210 of internal reference frame 204. Indeed, turning now to FIG. 3B, a representation of internal reference frame 204 of FIG. 2B is shown. FIG. 3B further comprises vector 216 representing ambient field vector 212 of FIG. 2B. As such, displacement of controller 200 may be represented via angle 218 between reference vector 214 and vector 216. Although vectors 214 and 216 are illustrated as being oriented substantially along a plane formed by axes 206 and 210, it will be appreciated that such a scenario is presented for the ease of understanding, and is intended to be non-limiting.

As mentioned above, magnetometers may experience non-idealities due to various environmental factors. Further, said non-idealities may be axis-dependent. In other words, the magnetometer of controller 200 may not detect ambient magnetic field as illustrated by vector 216. Instead, for example, magnetometer may detect the ambient magnetic field as represented by uncalibrated vector 220. Uncalibrated vector 220 may be displaced from vector 216 by first directional offset 222 along first axis 206 and/or second directional offset 224 along second axis 208. It will be appreciated that said offsets are presented for the purpose of example, and that the magnetometer may comprise offsets along any one or more axes without departing from the scope of the present disclosure.

Turning now to FIG. 2C, controller 200 is shown after forward rotation (i.e., 90 degree rotation along axis 206 of FIG. 2A) from the orientation of FIG. 2A. As illustrated, ambient field vector 212 is now oriented along the plane formed by first axis 206 and second axis 208.

Figure 3C:
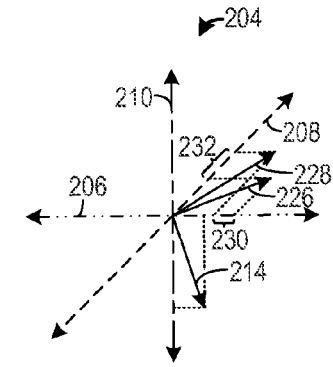

FIG. 3C shows a representation of internal reference frame 204 of FIG. 2C. FIG. 3C comprises vector 226 representing ambient field vector 212 of FIG. 3C. As with FIG. 3B, FIG. 3C further comprises uncalibrated vector 228, which may be displaced from vector 226 by first directional offset 230 along first axis 206 and second directional offset 232 along second axis 208. Accordingly, upon calibration of the magnetometer, vector 226 may be determined from vector 228 (e.g., via subtraction of offsets 230 and 232 from vector 228).

It will be appreciated from the preceding discussion that, since the magnetic field is substantially time-independent in both magnitude and direction during game play with reference to the external reference frame, measurement of the ambient magnetic field by a calibrated magnetometer should vary in orientation with the orientation of the magnetometer, while the magnitude stays the same. In other words, manipulation of the magnetometer through all possible orientations (i.e., 360 degree rotation about all three axes) should produce, within the internal reference frame of the magnetometer, an ambient field vector tracing the surface of a sphere centered at the origin with a radius equal to the magnitude of the ambient magnetic field.

It will be further appreciated that since the gain is substantially independent of environmental factors, the error in the measured ambient magnetic field may result in an offset of the center of the sphere from the origin and/or distortion of the sphere into an ellipsoid along one or more axes. Accordingly, providing calibration of the magnetometer may comprise determining an offset (e.g., center of sphere) along one or more axes and subsequently subtracting the offsets from the measured vector in order to provide a calibrated vector output. Two non-limiting embodiments for providing calibration of a game controller including a magnetometer will now be discussed in more detail.

Figure 4:
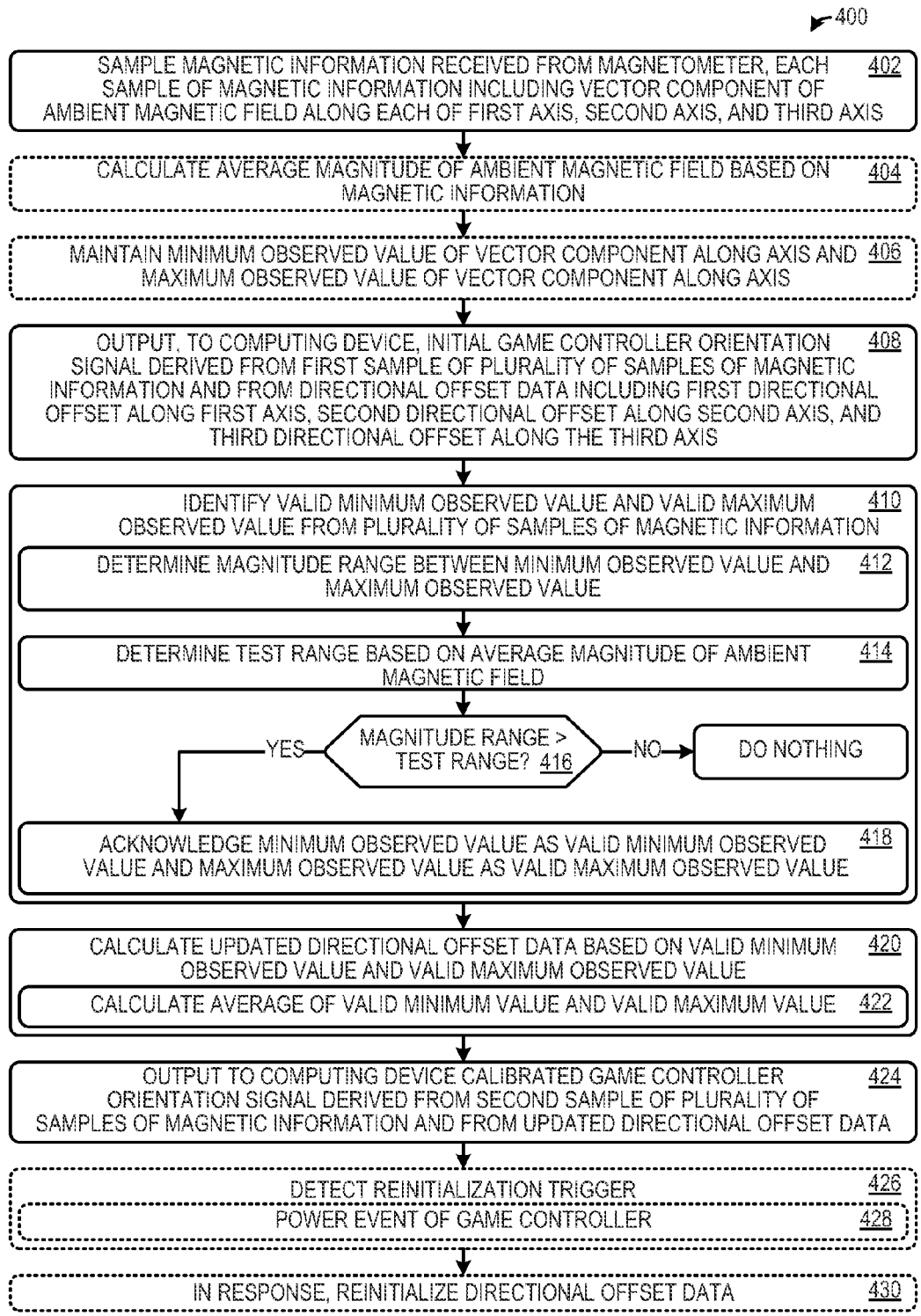
FIG. 4 shows a process flow of an embodiment of a method for calibrating a game controller including a magnetometer during game play.

Turning now to FIG. 4, a process flow depicting an embodiment of a method 400 for calibrating a game controller (e.g., game controller 102 of FIG. 1 and game controller 200 of FIGS. 2A-2C) including a magnetometer during game play is shown. At 402, method 400 comprises sampling magnetic information received from the magnetometer, each sample of the magnetic information including a vector component of an ambient magnetic field (e.g., ambient magnetic field vector 212) along each of a first axis (e.g., axis 206), a second axis (e.g., axis 208), and a third axis (e.g., axis 210), the first axis, the second axis, and the third axis being orthogonal to each other. As mentioned above, the first axis, the second axis, and the third axis are relative to the internal reference frame (e.g., reference frame 204) of the magnetometer, and such reference frame may comprise any suitable orientation within the controller without departing from the scope of the present disclosure.

At 404, method 400 may comprise calculating an average magnitude (e.g., root mean square) of the ambient magnetic field based on the magnetic information. For example, calculating the average magnitude may comprise, for each sample of the magnetic information, updating an average of the vector component along each of the first axis, the second axis, and the third axis. The average magnitude may therefore be calculated based on these averages.

Method 400 may further comprise, at 406, maintaining a minimum observed value of the vector component along the axis and a maximum observed value of the vector component along the axis for each of the first axis, the second axis, and the third axis. For example, each sample of the magnetic information may be compared to the maintained minimum and maximum values. If the sample includes a vector component that is less than the corresponding maintained minimum value, the maintained minimum value is updated based on the sample. Similarly, if the sample includes a vector component that is greater than the corresponding maintained maximum value, the maintained maximum value is updated based on the sample.

At 408, method 400 comprises outputting, to a computing device (e.g., computing device 104 of FIG. 1), an initial game controller orientation signal derived from a first sample of a plurality of samples of the magnetic information and from directional offset data including a first directional offset along the first axis, a second directional offset along the second axis, and a third directional offset along the third axis. As mentioned above, the initial game controller signal may be determined by subtracting the directional offset data from the magnetic information, although the initial game controller orientation may be calculated via different and/or additional mechanisms without departing from the scope of the present disclosure. The initial game controller orientation signal may be usable to effect control over the computing device and/or over applications (e.g., video game) presented thereby.

At 410, method 400 comprises, for each of the first axis, the second axis, and the third axis, identifying a valid minimum observed value and a valid maximum observed value from the plurality of samples of the magnetic information. Identifying the valid minimum observed value and the maximum observed value may comprise determining 412 a magnitude range between the minimum observed value and the maximum observed value. Identifying 410 further comprises determining 414 a test range based on the average magnitude of the ambient magnetic field. For example, in some embodiments, the test range may be equal to twice the average magnitude along the axis scaled by a factor less than one (e.g., 0.93). Identifying 410 may further comprise comparing the magnitude range to the test range at 416, and, if the magnitude range is greater than the test range, acknowledging 418 the minimum observed value as the valid minimum observed value and the maximum observed value as the valid maximum observed value.

Figure 5:
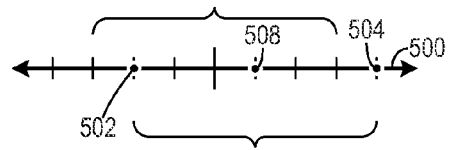
FIG. 5 shows an example axis including a maintained minimum value and a maintained maximum value.

For example, turning briefly to FIG. 5, an example axis 500 (e.g., axis 206, axis 208, axis 210, etc.) comprising a minimum value 502 (illustrated as −2) and a maximum value 504 (illustrated as +4) maintained from magnetic information received from a magnetometer is shown. Since the non-idealities of the magnetometer are substantially limited to directional offsets, range 506 (i.e., maximum 504 minus minimum 502) along a given axis should be substantially equal to twice the average measured field. Accordingly, in the illustrated example, if the average magnetic field is measured to be 3, minimum value 502 and maximum value 504 may be acknowledged as the valid minimum observed value and the maximum observed value, respectively.

Returning to FIG. 4, method 400 further comprises, at 420, calculating updated directional offset data based on the valid minimum observed value and the valid maximum observed value. The unfiltered directional offset data may be determined by calculating 422 an average of the valid minimum value and the valid maximum value. In some embodiments, the average may be filtered with a previous instance of the average. In some embodiments, calculating the updated directional offset data may comprise calculating unfiltered offset data based on the valid minimum value and the valid maximum value and filtering (e.g., via an increment/decrement filter) said unfiltered offset data with the directional offset data. An increment/decrement filter may comprise comparing the unfiltered offset data with the directional offset data, and, if the unfiltered offset data is larger than the directional offset data, increasing the directional offset data by a fixed amount. Conversely, if the unfiltered offset data is less than the directional offset data, the updated directional offset data may be determined by decreasing the directional offset data by a fixed amount. Such a filter may be useful in attenuating outlier data by ensuring that the effect of such data is limited to an incremental increase or decrease of the directional offset data. Returning to FIG. 5, average 508 of minimum 502 and maximum 504 equals +1. Accordingly, calibrated range 510 (i.e., range centered at the origin) is shifted to the left from range 506 by offset 508.

At 424, method 400 further comprises outputting to the computing device a calibrated game controller orientation signal derived from a second sample of the plurality of samples of the magnetic information and from the updated directional offset data. As with the initial game controller orientation signal, the calibrated game controller orientation signal may be usable to effect control over the computing device and/or over applications presented thereby. In this way, it will be appreciated that method 400 may be usable to concurrently effect control over the computing device and to continuously and automatically calibrate the signal(s) effecting said control during normal use of the game controller.

Method 400 may further comprise, at 426, detecting a reinitialization trigger. Although the direction and magnitude of the ambient electric field may remain substantially constant during a given instance of use, it will be appreciated that the magnetic field may vary between the instances of use (e.g., different environments, different date/time, physical trauma to controller, etc.). Accordingly, in some embodiments, the reinitialization trigger may comprise a power event 428 of the game controller (e.g., on/off, standby, etc.). In other words, since power events typically delineate the various instances of use, it may be desirable to reinitialize the data upon detection of such events. In other embodiments, a user may initiate a reinitialization trigger. It will be appreciated that these scenarios are presented for the purpose of example, and that the directional offset data may be reinitialized according to any suitable trigger or combination of triggers without departing from the scope of the present disclosure. Regardless of the trigger, method 400 thus further comprises, at 430, reinitializing the directional offset data in response to detecting the trigger.

It will be further appreciated that the calibration provided by method 400 may be susceptible to spikes in the ambient magnetic field that may occur during game play. In other words, if an anomalous minimum or maximum value is detected, the above-described calibration may experience errors until the directional offset data is reinitialized. It may therefore be desirable to utilize a different calibration mechanism that is less-susceptible to such anomalous fields.

Figure 6:
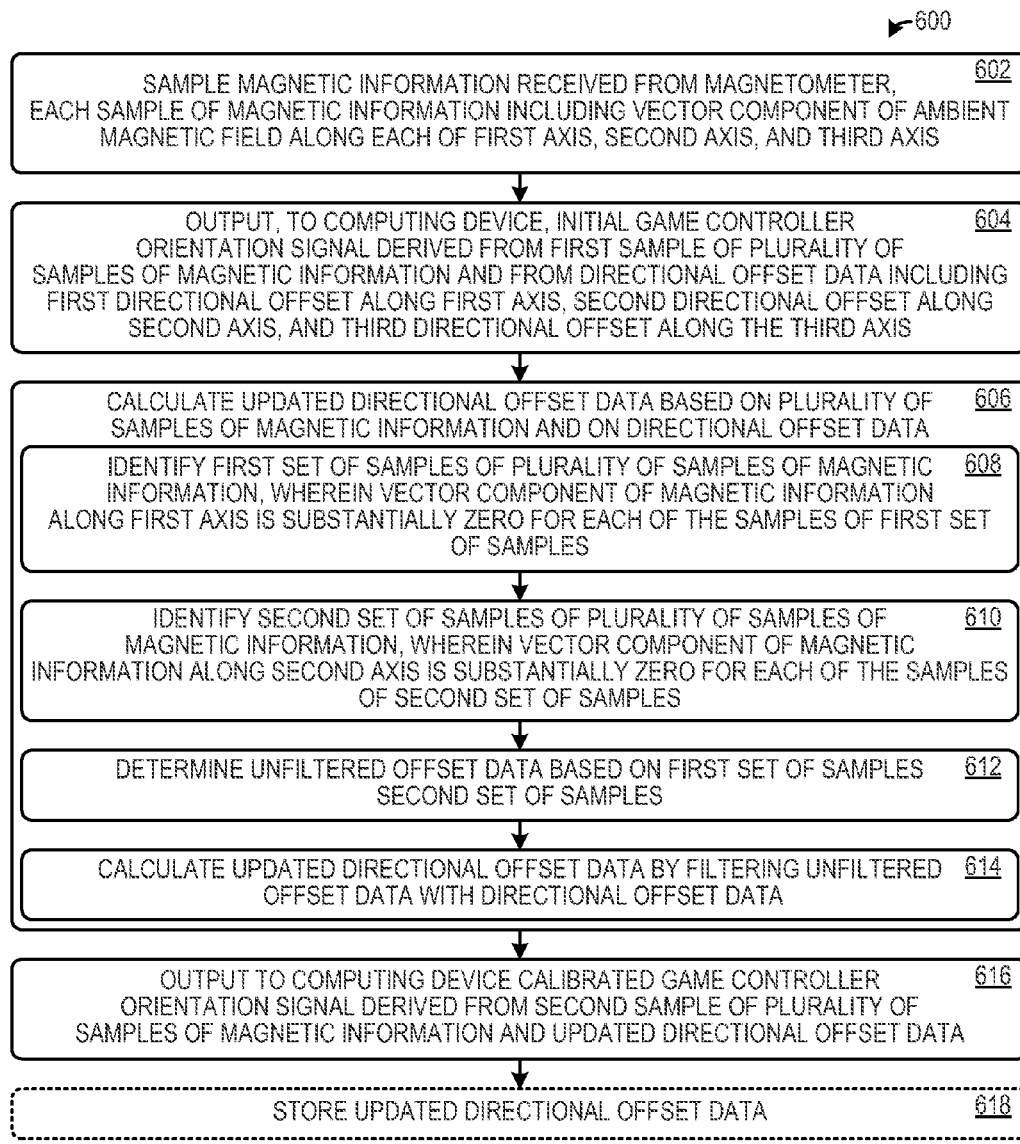
FIG. 6 shows a process flow of another embodiment of a method for calibrating a game controller including a magnetometer during game play.

Accordingly, turning now to FIG. 6, a process flow depicting another embodiment of a method 600 for calibrating a game controller including a magnetometer during game play is shown. Similar to method 400, method 600 comprises, at 602, sampling magnetic information received from the magnetometer, each sample of the magnetic information including a vector component of an ambient magnetic field (e.g., ambient magnetic field vector 212) along each of a first axis (e.g., first axis 206), a second axis (e.g., axis 208), and a third axis (e.g., axis 210). Method 600 further comprises, at 604, outputting, to a computing device (e.g., computing device 104 of FIG. 1), an initial game controller orientation signal derived from a first sample of a plurality of samples of the magnetic information and from directional offset data including a first directional offset along the first axis, a second directional offset along the second axis, and a third directional offset along the third axis.

At 606, method 600 comprises calculating updated directional offset data based on the plurality of samples of the magnetic information and on the directional offset data. Calculating 606 may comprise identifying 608 a first set of samples of the plurality of samples of the magnetic information, wherein the vector component of the magnetic information along the first axis is substantially zero for each of the samples of the first set of samples. Calculating 606 may further comprise identifying 610 a second set of samples of the plurality of samples of the magnetic information, wherein the vector component of the magnetic information along the second axis is substantially zero for each of the samples of the second set of samples.

Figure 7A:
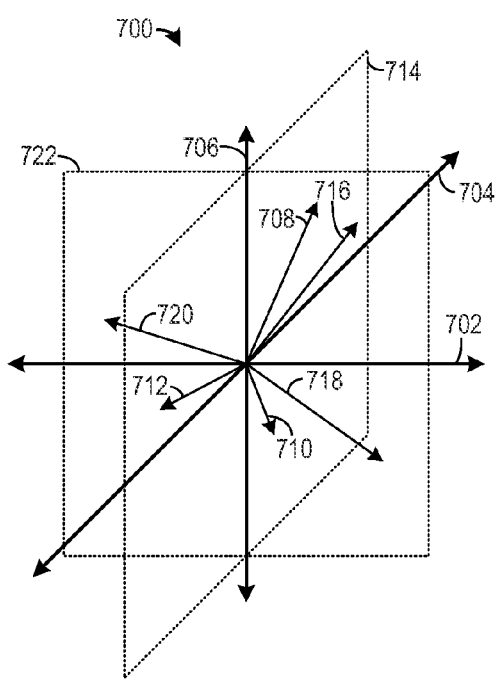
FIG. 7A shows an internal reference frame comprising a first set of samples along a first plane and a second set of samples along a second plane

For example, turning briefly to FIG. 7A, a representation of internal reference frame 700 (e.g., reference frame 204 of FIGS. 2 and 3) of a magnetometer including first axis 702, second axis 704, and third axis 706 is shown. FIG. 7 further comprises a first set of samples including samples 708, 710, and 712 comprising vector components along first axis 702 that are substantially zero. In other words, samples 708, 710, and 712 are oriented substantially along plane 714 formed by second axis 704 and third axis 706. FIG. 7 further comprises a second set of samples including samples 716, 718, and 720 comprising vector components along second axis 704 that are substantially zero (i.e., substantially along plane 722). Although both the first set of samples and the second set of samples each comprise three samples, it will be appreciated that the first set of samples and the second set of samples may comprise any suitable number of samples without departing from the scope of the present disclosure.

Returning to FIG. 6, calculating the updated directional offset data further comprises determining 612 unfiltered offset data based on the first set of samples and the second set of samples. In some embodiments, each set of samples may be used to "triangulate" the center of the samples, wherein the center corresponds to the directional offset along the axes of the plane. More generally speaking, when samples are measured which comprise vector components meeting certain criteria, the samples are used to solve an explicit equation to generate the offset value for each axis. To simplify the problem, and thus provide a better result, the three-dimensional solution may be broken down into two planar problems. For example, the offsets may be calculated for the X-Y plane and the Y-Z plane, though any two planes may be used without departing from the scope of the present disclosure. A plurality of samples (e.g., three) spanning the plane are determined in order to prevent singularities within the equation, and thus to provide stable results.

In order to provide said stable results, in some embodiments, the first set of samples and the second set of samples may be determined based on the angle between the samples. For example, in some embodiments, samples that are separated by an angle greater than or equal to a threshold angle (e.g., 75 degrees) may be used. In such embodiments, determining the first set of samples and the second samples may therefore comprise identifying a first valid sample, identifying a first candidate sample, determining an angle between the vector components of the first valid sample and the vector components of the first candidate sample, and, if the angle is greater than a threshold angle, acknowledging the first candidate sample as a second valid sample. In other embodiments, the threshold angle may be determined based on a number of identified valid samples. For example, as the number of valid samples increases, the threshold angle may decrease. It will be appreciated that these scenarios are presented for the purpose of example, and the threshold angle may be determined via any suitable mechanism or combination of mechanisms without departing from the scope of the present disclosure.

Figure 7B:
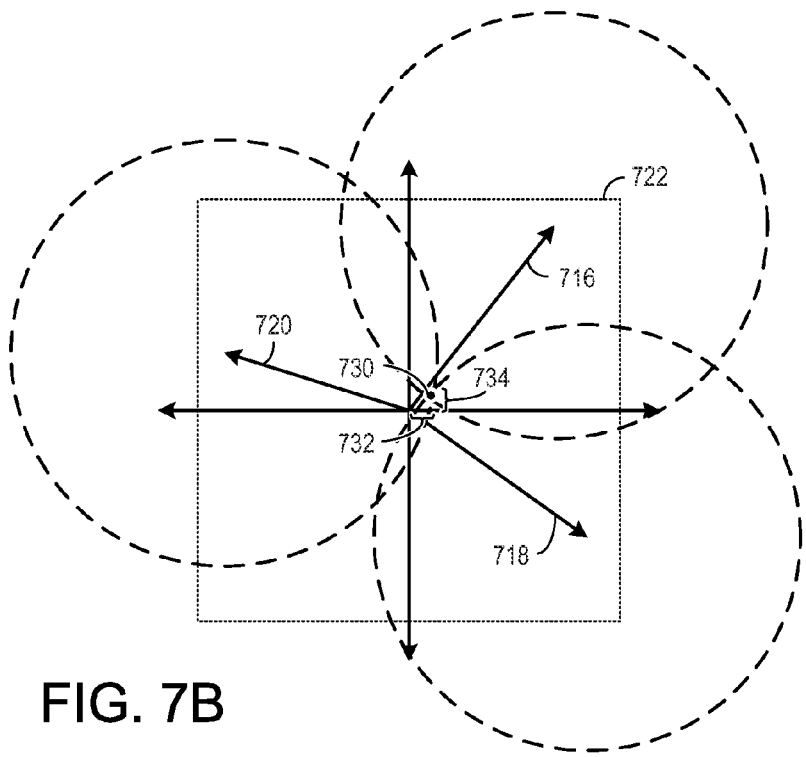
FIG. 7B shows the second plane of FIG. 7A including the second set of samples.

Turning now to FIG. 7B, plane 722 (i.e., plane formed by first axis 702 and third axis 706) is shown with samples 716, 718, and 720 oriented substantially along the plane. Samples 716, 718, and 720 may be considered vectors oriented substantially along plane 722 centered at the origin and comprising endpoints at coordinates $(X_1, Z_1)$, $(X_2, Z_2)$, and $(X_3, Z_3)$, respectively. As mentioned previously, the magnetic information of a magnetometer oriented in all possible combinations will produce a sphere centered at the origin. Since it is known that samples 716, 718, and 720 are on a circle comprising an unknown offset on each axis, it is possible to solve for the amount of offset occurring (e.g., center 730 of the sphere). Accordingly, the first directional offset 732 (e.g., $X_{os}$) and the third directional offset 734 (e.g., $Z_{os}$) may be calculated as follows, $$X_{os} = \frac{\Delta_{13}(Z_2 - Z_1) - \Delta_{21}(Z_1 - Z_3)}{2[(X_1 - X_2)(Z_1 - Z_3) - (X_3 - X_1)(Z_2 - Z_1)]}$$

$$Z_{os} = \frac{\Delta_{21}}{2(Z_2 - Z_1)} + X_{os}\frac{X_1 - X_2}{(Z_2 - Z_1)}$$

where $$\Delta_{13} = (X_1^2 + Z_1^2) - (X_3^2 + Z_3^2)$$

$$\Delta_{21} = (X_2^2 + Z_2^2) - (X_1^2 + Z_1^2).$$

A similar approach may be usable to determine the directional offsets along plane 714 (e.g., $Y_{os}$ and $Z_{os}$) via samples 708, 712, and 712 with proper substitution of vector components. Although the above discussion was directed towards planes 714 and 722, it will be appreciated, as mentioned above, that any two planes may be usable to determine the offset along the three axes.

Returning to FIG. 6, method 600 further comprises calculating 614 the updated directional offset data by filtering the unfiltered offset data with the directional offset data. For example, in some embodiments an increment/decrement filter may be used. It will be appreciated that other filtering mechanisms maybe used without departing from the scope of the present disclosure.

Method 600 further comprises, at 616, outputting to the computing device a calibrated game controller orientation signal derived from a second sample of the plurality of samples of the magnetic information and the updated directional offset data. Further, in contrast to method 400 of FIG. 4, method 600 may be usable over time (e.g., across a plurality of use instances). Accordingly, method 600 may further comprise, at 618, storing the updated directional offset data. In other words, the directional offset data may be accumulated over time in order to provide a "history" of directional offset data. Accordingly, in such embodiments, the stored updated directional offset data may comprise the "directional offset data" used to derive the "initial game controller orientation signal" during future uses of the game controller.

While discussed above in the context of a U-shaped handle, it is to be understood that wireless controllers may have virtually any shape without departing from the scope of this disclosure. As another nonlimiting example, FIG. 8 shows a wireless controller 800 including a substantially circular (i.e., O-shaped) handle portion 802 configured to be held in one or both hands by the game player. It will be appreciated that such configurations are presented for the purpose of example, and are not intended to be limiting in any manner.

In some embodiments, the methods and processes described above may be tied to a computing system of one or more computing devices. In particular, such methods and processes may be implemented as a computer-application program or service, an application-programming interface (API), a library, and/or other computer-program product.

Figure 9:
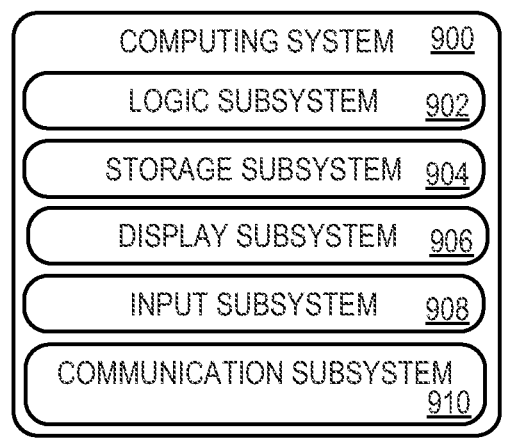
FIG. 9 shows a non-limiting computing device in accordance with an embodiment of the present disclosure.

FIG. 9 schematically shows a non-limiting embodiment of a computing system 900 that can enact one or more of the methods and processes described above. Game controller 102 and computing device 104 of FIG. 1 and game controller 200 of FIGS. 2A-2C are non-limiting examples of computing system 900. Computing system 900 is shown in simplified form. It will be understood that virtually any computer architecture may be used without departing from the scope of this disclosure. In different embodiments, computing system 900 may take the form of a mainframe computer, server computer, desktop computer, laptop computer, tablet computer, home-entertainment computer, network computing device, gaming device, mobile computing device, mobile communication device (e.g., smart phone), etc.

Computing system 900 includes a logic subsystem 902 and a storage subsystem 904. Computing system 900 may optionally include a display subsystem 906, input subsystem 908, communication subsystem 910, and/or other components not shown in FIG. 9.

Logic subsystem 902 includes one or more physical devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, or otherwise arrive at a desired result.

The logic subsystem may include one or more processors configured to execute software instructions. Additionally or alternatively, the logic subsystem may include one or more hardware or firmware logic machines configured to execute hardware or firmware instructions. The processors of the logic subsystem may be single-core or multi-core, and the programs executed thereon may be configured for sequential, parallel or distributed processing. The logic subsystem may optionally include individual components that are distributed among two or more devices, which can be remotely located and/or configured for coordinated processing. Aspects of the logic subsystem may be virtualized and executed by remotely accessible, networked computing devices configured in a cloud-computing configuration.

Storage subsystem 904 includes one or more physical, non-transitory, devices configured to hold data and/or instructions executable by the logic subsystem to implement the methods and processes described herein. When such methods and processes are implemented, the state of storage subsystem 904 may be transformed—e.g., to hold different data.

Storage subsystem 904 may include removable media and/or built-in devices. Storage subsystem 904 may include optical memory devices (e.g., CD, DVD, HD-DVD, Blu-Ray Disc, etc.), semiconductor memory devices (e.g., RAM, EPROM, EEPROM, etc.) and/or magnetic memory devices (e.g., hard-disk drive, floppy-disk drive, tape drive, MRAM, etc.), among others. Storage subsystem 904 may include volatile, nonvolatile, dynamic, static, read/write, read-only, random-access, sequential-access, location-addressable, file-addressable, and/or content-addressable devices.

It will be appreciated that storage subsystem 904 includes one or more physical, non-transitory devices. However, in some embodiments, aspects of the instructions described herein may be propagated in a transitory fashion by a pure signal (e.g., an electromagnetic signal, an optical signal, etc.) that is not held by a physical device for a finite duration. Furthermore, data and/or other forms of information pertaining to the present disclosure may be propagated by a pure signal.

In some embodiments, aspects of logic subsystem 902 and of storage subsystem 904 may be integrated together into one or more hardware-logic components through which the functionally described herein may be enacted. Such hardware-logic components may include field-programmable gate arrays (FPGAs), program- and application-specific integrated circuits (PASIC/ASICs), program- and application-specific standard products (PSSP/ASSPs), system-on-a-chip (SOC) systems, and complex programmable logic devices (CPLDs), for example.

The terms "module," "program," and "engine" may be used to describe an aspect of computing system 900 implemented to perform a particular function. In some cases, a module, program, or engine may be instantiated via logic subsystem 902 executing instructions held by storage subsystem 904. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 906 may be used to present a visual representation of data held by storage subsystem 904. This visual representation may take the form of a graphical user interface (GUI). As the herein described methods and processes change the data held by the storage subsystem, and thus transform the state of the storage subsystem, the state of display subsystem 906 may likewise be transformed to visually represent changes in the underlying data. Display subsystem 906 may include one or more display devices utilizing virtually any type of technology. Such display devices may be combined with logic subsystem 902 and/or storage subsystem 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 900 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of calibrating a game controller including a magnetometer during game play, comprising:
   sampling magnetic information received from the magnetometer, each sample of the magnetic information including a vector component of an ambient magnetic field along each of a first axis, a second axis, and a third axis, the first axis, the second axis, and the third axis being orthogonal to each other;
   outputting, to a computing device, an initial game controller orientation signal derived from a first sample of a plurality of samples of the magnetic information and from directional offset data including a first directional offset along the first axis, a second directional offset along the second axis, and a third directional offset along the third axis;
   calculating updated directional offset data by filtering unfiltered directional offset data with the directional offset data; and
   outputting to the computing device a calibrated game controller orientation signal derived from a second sample of the plurality of samples of the magnetic information and the updated directional offset data.

2. The method of claim 1, wherein calculating the updated directional offset data further comprises:
   identifying a first set of samples of the plurality of samples of the magnetic information;
   identifying a second set of samples of the plurality of samples of the magnetic information; and
   determining the unfiltered directional offset data based on the first set of samples and the second set of samples.

3. The method of claim 2, wherein identifying the first set of samples and the second set of samples includes:
   identifying a first valid sample;
   identifying a first candidate sample;
   determining an angle between the vector components of the first valid sample and the vector components of the first candidate sample;
   if the angle is greater than a threshold angle, acknowledging the first candidate sample as a second valid sample.

4. The method of claim 3, wherein the threshold angle is 75 degrees.

5. The method of claim 2, wherein filtering the unfiltered directional offset data with the directional offset data includes using an increment/decrement filter.

6. The method of claim 2, wherein the first set of samples and the second set of samples each include three samples of the magnetic information.

7. The method of claim 1, wherein the initial game controller orientation signal and the calibrated game controller orientation signal are usable by the computing device to effect control over a virtual object presented by the computing device.

8. The method of claim 1, further comprising storing the updated directional offset data.

9. A game controller comprising:
a magnetometer configured to output magnetic information representing an ambient magnetic field;
a communication subsystem configured to provide communication with a computing device;
a logic subsystem; and
a storage subsystem storing instructions that are executable by the logic subsystem to:
sample the magnetic information received from the magnetometer, each sample of the magnetic information including a vector component of the ambient magnetic field along each of a first axis, a second axis, and a third axis, the first axis, the second axis, and the third axis being orthogonal to each other;
output, to a computing device, an initial game controller orientation signal derived from a first sample of a plurality of samples of the magnetic information and from directional offset data including a first directional offset along the first axis, a second directional offset along the second axis, and a third directional offset along the third axis;
calculate updated directional offset data by filtering unfiltered directional offset data with the directional offset data; and
output to the computing device a calibrated game controller orientation signal derived from a second sample of the plurality of samples of the magnetic information and the updated directional offset data.

10. The game controller of claim 9, further comprising a handle portion coupled to the magnetometer and configured to be held in one or both hands, the handle portion comprising one or more of a U-shaped wheel and an O-shaped wheel.

11. The game controller of claim 9, wherein the communication subsystem is configured to communicate with the computing device via a wireless connection.

12. The game controller of claim 9, wherein the initial game controller orientation signal and the calibrated game controller orientation signal are usable by the computing device to effect control over a virtual object presented by the computing device.

13. The game controller of claim 9, wherein calculating the updated directional offset data further comprises:
identifying a first set of samples of the plurality of samples of the magnetic information;
identifying a second set of samples of the plurality of samples of the magnetic information; and
determining the unfiltered directional offset data based on the first set of samples and the second set of samples.

14. The game controller of claim 13, wherein filtering the unfiltered offset data with the directional offset data comprises using an increment/decrement filter.

15. A method of calibrating a game controller including a magnetometer during game play, comprising:
obtaining a first plurality of samples of magnetic information received from a magnetometer, each sample of the first set of samples including a vector component of an ambient magnetic field along each of a first axis, a second axis, and a third axis;
obtaining directional offset data previously calculated during game play, the directional offset data including a first directional offset along the first axis, a second directional offset along the second axis, and a third directional offset along the third axis;
outputting to a computing device a first game controller orientation signal derived from the directional offset data and a first sample of the first plurality of samples of the magnetic information;
updating the directional offset data by filtering unfiltered directional offset data with the directional offset data;
obtaining a second plurality of samples of the magnetic information received from the magnetometer;
outputting to the computing device a second game controller orientation signal derived from updated directional offset data and a first sample of the second plurality of samples of the magnetic information.

16. The method of claim 15, wherein updating the directional offset data further comprises:
identifying a first set of samples of the first plurality of samples of the magnetic information;
updating the second directional offset data and third directional offset data based on the first set of samples;
identifying a second set of samples of the plurality of samples of the magnetic information; and
updating the first directional offset data and the third directional offset data based on the second set of samples.

17. The method of claim 16, wherein identifying the first set of samples and the second set of samples comprises determining if an angle between each of the samples is greater than a threshold angle.

18. The method of claim 17, wherein the threshold angle is 75 degrees.

19. The method of claim 15, wherein the first game controller orientation signal and the second game controller orientation signal are usable by the computing device to effect control over a virtual object presented by the computing device.

20. The method of claim 15, further comprising storing the updated directional offset data.

* * * * *